US006616854B2

(12) United States Patent
Jones et al.

(10) Patent No.: US 6,616,854 B2
(45) Date of Patent: Sep. 9, 2003

(54) METHOD OF BONDING AND TRANSFERRING A MATERIAL TO FORM A SEMICONDUCTOR DEVICE

(75) Inventors: Robert E. Jones, Austin, TX (US); Sebastian Csutak, Austin, TX (US)

(73) Assignee: Motorola, Inc., Schaumbrug, IL (US)

( * ) Notice: Subject to any disclaimer, the term of this patent is extended or adjusted under 35 U.S.C. 154(b) by 0 days.

(21) Appl. No.: 10/022,711

(22) Filed: Dec. 17, 2001

(65) Prior Publication Data

US 2003/0114001 A1 Jun. 19, 2003

(51) Int. Cl.$^7$ ............................................. C03C 15/00
(52) U.S. Cl. ............................. 216/33; 216/35; 216/36; 438/455
(58) Field of Search ............................. 216/33, 35, 36; 438/455, 457, 458

(56) References Cited

U.S. PATENT DOCUMENTS

| | | | |
|---|---|---|---|
| 4,966,646 A | | 10/1990 | Zdeblick |
| 5,444,289 A | * | 8/1995 | Cambou et al. ............. 257/510 |
| 5,801,313 A | * | 9/1998 | Horibata et al. .............. 73/718 |
| 6,049,638 A | * | 4/2000 | Norimatsu et al. ........... 385/14 |
| 6,093,623 A | | 7/2000 | Forbes |
| 6,191,007 B1 | | 2/2001 | Matsui |
| 6,271,101 B1 | * | 8/2001 | Fukunaga .................... 438/455 |
| 6,400,009 B1 | * | 6/2002 | Bishop et al. ............... 257/704 |

OTHER PUBLICATIONS

Maura Raburn et al., "InP–InGaAsP Wafer–Bonded Vertically Coupled X–Crossing Multiple Channel Optical Add–Drop Multiplexer", IEEE Photonics Technology Letters, vol. 13, No. 6, Jun. 2001, pp. 579–581.

A.J.Auberton–Herv'e, "SOI: Materials to Systems", IEEE 1996 International Electron Device Meeting (IEDM), Dec. 1996, pp. 1.1.1–1.1.8.

Weishu Wu et al., "Design of Silicon Hetero–Interface Photodetectors", 1997 IEEE Journal of Lightwave Technology, vol. 15, No. 8, Aug., 1997, pp. 1608–1615.

Z.–H. Zhu et al., "Wafer Bonding Technology and Its Applications in Optoelectronic Devices and Materials", 1997 IEEE Journal of Selected Topics In Quantum Electronics, vol. 3, No. 3, Jun. 1997, pp. 927–1061.

Keith W. Goossen et al., "Very Large Arrays of Flip–Chip Bonded 1.55 ∞m Photodetectors", 1998 IEEE Journal of Lightwave Technology, vol. 16, No. 6, Jun. 1998, pp. 1056–1061.

William G. En, et al., "The Genesis Process™: A New SOI wafer fabrication method", Proceedings 1998 IEEE International SOI Conference, Oct. 1998, pp. 163–164.

C.H. Yun et al., "Thermal and Mechanical Separations of Silicon Layers from Hydrogen Pattern–Implanted Wafers", Journal of Electronic Materials, vol. 30, No. 8, 2001, pp. 960–964.

Annex to Form PCT/ISA/206 "Commuication Relating to the Results of the Partial International Search."

* cited by examiner

Primary Examiner—Robert Kunemund
Assistant Examiner—Lan Vinh
(74) Attorney, Agent, or Firm—Patricia S. Goddard; Kim-Marie Vo

(57) ABSTRACT

A donor substrate (12) which is patterned to include a donor mesa (18) is bonded to a receiving substrate (20). In a one embodiment, a bulk portion of the donor substrate is removed while leaving a transferred layer (26) bonded to the receiving substrate. The transferred layer is a layer of material transferred from the donor mesa. A portion of receiving substrate can be processed to form a recess (27, 28, or 32) to receive the donor mesa. Alternatively, the transferred layer can be formed over a dummy feature (46) formed on the receiving substrate, either with or without the use of mesas on the donor substrate. In a preferred embodiment, the transferred layer is used to form an optical device such as a photodetector in a semiconductor device. With the invention, bonding can be achieve despite having a non-planar surface on the receiving substrate.

29 Claims, 3 Drawing Sheets

METHOD OF BONDING AND TRANSFERRING A MATERIAL TO FORM A SEMICONDUCTOR DEVICE

FIELD OF THE INVENTION

The present invention relates generally to semiconductor device manufacturing and more specifically to techniques to make semiconductor devices which utilize wafer bonding.

BACKGROUND OF THE INVENTION

Wafer bonding is a known technique to form two distinct single crystalline semiconductor materials within one final device. The two materials may have the same composition or be dissimilar materials. For example, two silicon wafers can be bonded together, or a germanium or gallium arsenide wafer may be bonded to a silicon wafer. In many instances, the two wafers are separated by a dielectric layer, which serves not only as an electrical isolation layer but also as an adhesion layer to form the bond.

In applications where devices are to be formed in both semiconductor wafers, it is desirable for one of the wafers to be sufficiently thin to facilitate device fabrication and formation of interconnects to the devices. However, starting off with a sufficiently thin wafer to bond to the receiving wafer is not practical because it has insufficient structural strength. One method to achieve a sufficiently thin bonded layer is to etch back one of the wafers after bonding. But this method can be undesirable in applications where a very thin resulting layer is required because such a large amount of the wafer material must be etched away and it is difficult to control the thickness uniformity of the remaining layer. An alternative technique has been developed which effectively transfers a thin layer of semiconductor material from a donor wafer onto the receiving wafer. The thin layer is defined in the donor wafer, for example, by performing a hydrogen implant to create a weakened region within the semiconductor wafer. The donor wafer and receiving wafer are bonded together, and a subsequent anneal process or cleaving process is used to separate the thin layer at the weakened region from the remainder of the donor wafer.

The above wafer bonding techniques are particularly useful in applications where the two wafers to be bonded are very planar, for example in forming silicon on insulator (SOI) on a silicon wafer. However, there are problems in applying the prior art wafer bonding techniques to applications in which the receiving substrate is not planar, for example where active devices and interconnect are already formed or are partially formed on the receiving wafer. Therefore, there is a need for an improved wafer bonding technique to accommodate non-planar wafers.

Moreover, it would be desirable for such a technique to also permit one of the semiconductor materials to be bonded and transferred only in selected areas to the other semiconductor material. While attempts have been made to accomplish selective bonding (e.g. by selectively performing a hydrogen implant in a silicon wafer in areas corresponding to where bonding was desired), such attempts fail to simultaneously address the problem of bonding to a non-planar receiving substrate.

BRIEF DESCRIPTION OF THE DRAWINGS

The present invention is illustrated by way of example and not limited by the accompanying figures, in which like reference numerals indicate similar elements, and in which.

Figure 1:
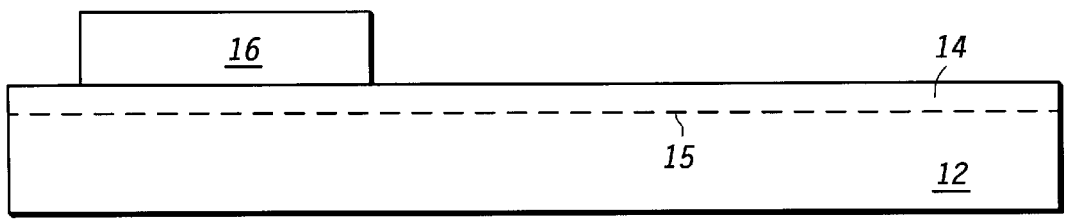
FIGS. 1–4 illustrate in partial, cross-sectional views a processing sequence for forming a semiconductor device in accordance with one embodiment of the present invention in which a semiconductor material is selective transferred and bonded to a dielectric layer formed on a semiconductor substrate.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms front, back, top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

Generally, the present invention addresses both the problem of bonding to a non-planar receiving substrate and providing a bonded region only in selected portions of the receiving substrate. In one embodiment, a donor substrate is fabricated to include a raised portion (later referred to as a donor mesa) so that only this raised portion is transferred to the receiving substrate. Thus, lack of global planarity of the receiving substrate does not adversely impact the bonding process. Moreover, a higher degree of planarity of the final structure after bonding can be achieved by providing corresponding recesses in the receiving substrate. In another embodiment, the receiving substrate is provided with a dummy feature which effectively raises the area of the receiving substrate where bonding of another semiconductor material is to occur. By making the area of the receiving substrate where bonding of another semiconductor material is to occur at least as high or higher than other structures on the receiving substrate, sufficient bonding at this area can be assured.

FIGS. 1–4 illustrate in, partial cross-sectional views, a fabrication sequence for forming a semiconductor device 10 in accordance with one embodiment of the present invention. In FIG. 1, a donor substrate 12 is provided. The bulk material of donor substrate 12 is preferrably comprised of a single crystalline semiconductor material, such as silicon, germanium, gallium arsenide, indium phosphide or the like. In a preferred embodiment and application of the invention to be described throughout this application, donor substrate comprises germanium. Also as illustrated in FIG. 1, donor substrate 12 has an implant region 14 formed, for example, by implanting hydrogen in a surface of the donor substrate 12. The purpose of creating implant region 14 is to create a transfer layer, wherein a thin layer of the donor substrate can be transferred to another substrate. Other methods of creating a transfer layer can alternatively be used. For example, a strained lattice layer can be formed on a surface of the donor substrate and a transfer layer can be grown on the strained lattice layer.

The depth or thickness of implant region 14 is chosen to equal the desired thickness of semiconductor material which is to be transferred to the receiving substrate. The implant energy is chosen so that the projected range or peak concentration of the implanted species (represented by the dashed line 15 of FIG. 1) equals the desired depth. Typically this depth will range from 0.1 $\mu$m to 2 $\mu$m, with implant doses ranging from $1 \times 10^{16}$ to $1 \times 10^{17}$ atoms per cubic centimeter. In a preferred embodiment where the transferred material is to be used as a photodetector, hydrogen is preferably implanted into a germanium wafer to a depth of 1 to 2 $\mu$m.

Figure 2:
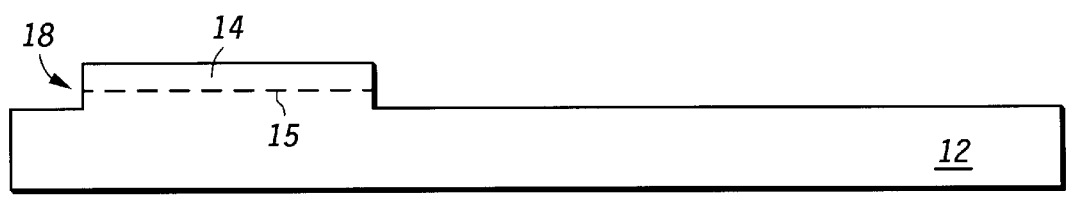

After forming a transfer layer, whether by implantation or another technique, donor substrate 12 is patterned so that the transfer layer is present in only selected areas. As illustrated in FIG. 1, this is accomplished by depositing and patterning a photoresist layer to form a photoresist mask 16 which protects the transfer layer in selected areas. The donor substrate is then etched to form a donor mesa 18 as shown in FIG. 2 using photoresist mask 16 as an etch mask. Preferably, donor substrate 12 is etched to remove the implant region 14 in areas other than (i.e. beyond) donor mesa 18 so that only material within donor mesa 18 is transferred from donor substrate 12 to a receiving substrate. Areas other than the donor mesa may be referred to as a bulk portion of the substrate. Conventional etching chemistries and techniques are used to perform this etch and will be dependent upon the particular materials present on donor substrate 12. In a preferred embodiment in which the donor substrate 12 comprises hydrogen implanted germanium, a suitable etch to form donor mesa 18 is a chlorine or fluorine containing plasma etch chemistry. Alternatively, wet etch chemistries such as hydrogen peroxide ($H_2O_2$) containing aqueous solutions can be employed to form the donor mesa 18. While only one donor mesa 18 is illustrated, one of skill in the art will appreciate that any number of such mesas can be formed.

In an alternative embodiment, donor substrate 12 can be patterned to form one or more donor mesas prior to implanting or otherwise processing the substrate to form the transfer layer. In this alternative embodiment, a hydrogen implant occurs after mesa formation, and the height of the mesa and the implant conditions are tailored so that only the material within the mesa region is transferred to the receiving substrate, as will become more apparent below.

Figure 3:
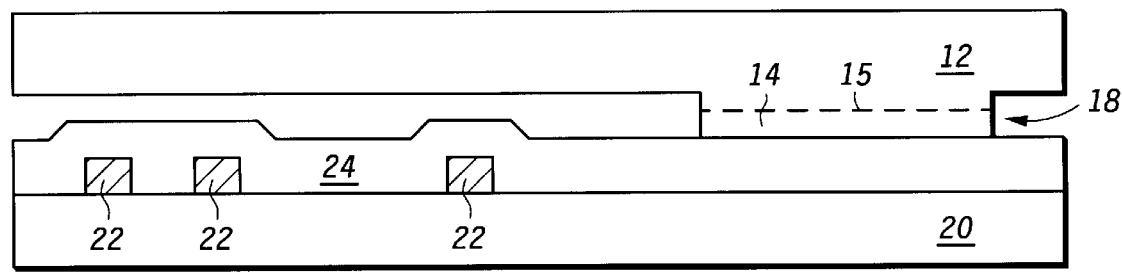
Figure 4:
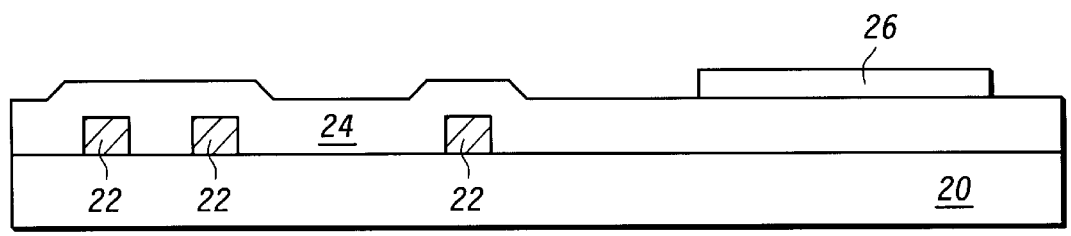

After forming or otherwise providing a patterned donor substrate 12, the patterned donor substrate is bonded to a receiving substrate 20 as illustrated in FIG. 3. The bulk material of receiving substrate is preferably comprised of a single crystalline semiconductor material such as such as silicon, germanium, gallium arsenide, indium phosphide or the like. In a preferred embodiment, receiving substrate 20 is comprised of silicon. Receiving substrate 20 may include active and/or passive devices formed either within or on the bulk substrate material. The particulars of such devices are not important for understanding the present invention. Accordingly, only representative and selected elements of such devices are shown in the figures. For example, as shown in FIG. 3, receiving substrate 20 includes a plurality of conductive members 22 having a first overlying dielectric layer 24. Conductive members may be formed of polysilicon or metal in accordance with conventional practices. Dielectric layer 24 is likewise formed using known techniques, and in a preferred embodiment will comprise silicon dioxide ($SiO_2$).

As shown in FIG. 3, and as will occur in many applications, receiving substrate 20 does not have a planar upper surface. Accordingly, prior art techniques for bonding another semiconductor substrate to it have the problems previously described. In accordance with the present invention, these problems are overcome by bonding a patterned donor semiconductor substrate to the receiving substrate. More specifically, donor substrate 12 is positioned relative to receiving substrate 20 so that donor mesa 18 is aligned to the portion of receiving substrate 20 which is to receive the transferred layer. As shown, the donor mesa is aligned so as not to overlie any active circuitry within receiving substrate 20; however, this is not a requirement in all applications of the present invention.

After donor mesa 18 is sufficiently aligned, the receiving substrate 20 and donor substrate 12 are bonded together in the areas where contact is made, namely where the donor mesa is in contact with an upper surface of receiving substrate 20. Bonding can be accomplished by any of the known wafer bonding techniques, but generally will include a pressure and a temperature treatment to create a sufficiently strong bond. Existing materials within either receiving substrate 20 or donor substrate 12 may limit what temperature the bonding, and subsequent processing, can occur. Otherwise, the particular bonding technique is not limited by the invention.

It is note that while it appears that the donor substrate 20 is not supported on the left side of device 10 as illustrated in FIG. 3, this generally won't be the case. Donor substrate 12 and receiving substrate 20 are preferably in wafer form with each having a plurality of device sites. Accordingly, donor substrate 12 will likely be supported at least by another adjacent device site on the receiving substrate, and may even be supported elsewhere within the site of device 10. If this support is not sufficient, additional mesas can be provided for additional structural support.

Once the donor substrate 12 is bonded to the receiving substrate 20, a separation or transfer step occurs. In this step, shown in FIG. 4, the bulk portion of the donor substrate 12 is removed. In other words, donor substrate 12 is removed everywhere other than where the implant region 14 of donor mesa 18 is bonded to receiving substrate 12. The result produces a transfer layer 26. Separation of transfer layer 26 from the rest of donor substrate 12 can be accomplished by known techniques. For example, a thermal technique can be used in which hydrogen bubbles form at the peak concentration of the implanted hydrogen (represented by dashed line 15). The presence of the bubbles facilitate separation of the transfer layer at this location within the donor mesa 18. Alternatively, mechanical process can be applied to cause the separation at the same location within the donor mesa, for example by cleaving using ultrasonic vibration, fluid jets, or the like.

After separation of transfer layer 26 from the rest of donor substrate 12, devices can be formed in the transfer layer 26, and interconnections can be made thereto. In a preferred embodiment, transfer layer 26 is used to create a photodetector by implanting N-type and P-type conductive fingers with undoped regions therebetween. Interconnects are then formed to connect the conductive fingers to circuitry formed within receiving substrate 20.

Figure 6:
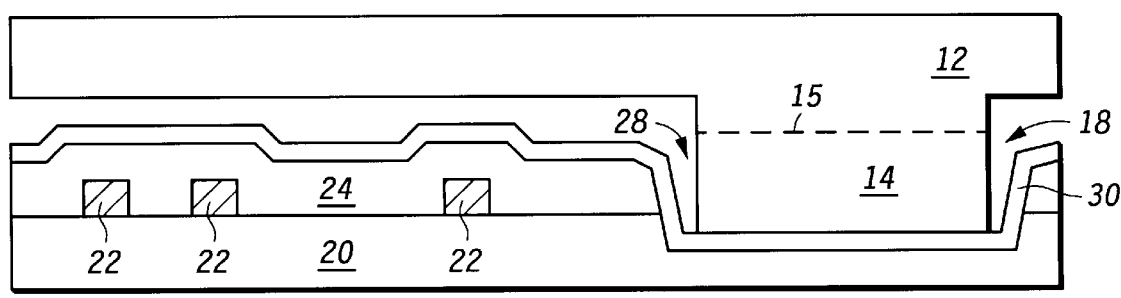
FIG. 6 illustrates in a partial, cross-sectional view an alternative embodiment of the present invention in which a semiconductor material is selective transferred and bonded to a dielectric layer which lines a trench formed within a semiconductor substrate.
Figure 7:
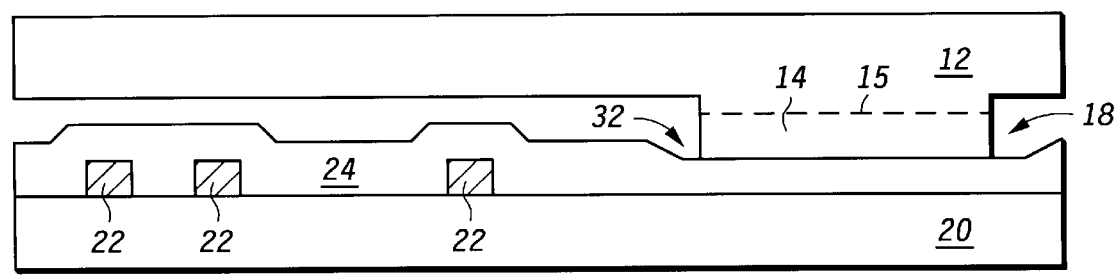
FIG. 7 illustrates in a partial, cross-sectional view an alternative embodiment of the present invention in which a semiconductor material is selective transferred and bonded to a dielectric layer formed on a semiconductor substrate which has been recessed.

In the embodiment of the invention shown and described in reference to FIGS. 1–4 the bonding of the donor mesa 18 occurs on dielectric layer 24 of the receiving substrate 20 without any special accommodation made for receiving the donor mesa. In alternative embodiments, receiving substrate 20 is processed to create a receiving cavity for the donor mesa to result in a more planar final structure. In certain applications, the desired thickness of transferred layer 26 may be so large that the final bonded and transferred structure is not adequately planar for subsequent processing. To accommodate such a thick transfer layer, a cavity in the receiving substrate can be formed to an appropriate depth to achieve a sufficient final planarity. For example, in FIG. 5, dielectric layer 24 is patterned to create an opening 27 which exposes a surface of the bulk semiconductor material of receiving substrate 20. Alternatively, a cavity or trench 28 can be formed in the bulk material of receiving substrate 20, as shown in FIG. 6. Or, dielectric layer 24 can be etched to create a recess 32 which does not expose underlying layers of receiving substrate 20, as shown in FIG. 6. In each of the embodiments of FIGS. 5–7, the receiving cavity (either opening 27, trench 28, or recess 32) is formed in accordance with known etching techniques which will be dependent upon the materials needing to be removed.

Figure 5:
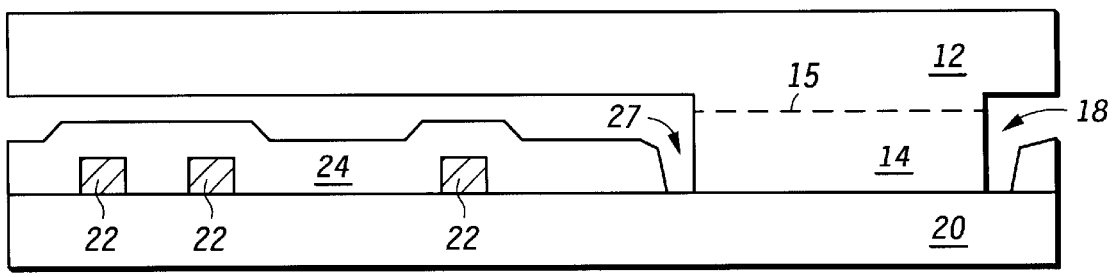
FIG. 5 illustrates in a partial, cross-sectional view an alternative embodiment of the present invention in which a semiconductor material is selectively transferred and bonded directly to a semiconductor material.

As illustrated in the embodiment shown in FIG. 5, the donor mesa 18 is bonded to the bulk material of receiving substrate 20 (i.e. it is a semiconductor-to-semiconductor bond) rather than the mesa being bonded to a dielectric material. This may be advantageous in applications in which a heterostructure device is desired (e.g. germanium on silicon, indium gallium arsenide on gallium arsenide, etc.). To achieve a semiconductor-to-semiconductor bond, care should be taken to prevent or minimize the formation of a native oxide layer on the exposed semiconductor surface which may degrade bond strength or heterojunction device operation.

In any of the above-mentioned alternatives, an optional dielectric layer 30 can be deposited on receiving substrate 20 prior to bonding the donor mesa to it. Dielectric layer 30 can be used to provide electrical isolation between the two substrate materials (as shown in FIG. 6) or to enhance the bonding of the two substrates. Suitable materials for dielectric layer 30 include $SiO_2$, fluorinated $SiO_2$, benzocyclobutene (BCB), methylsilsequioxane (MSSQ), and other materials proposed for bonding "glue layers." The dielectric layer 30, if used, can be deposited using conventional processes.

Figure 8:
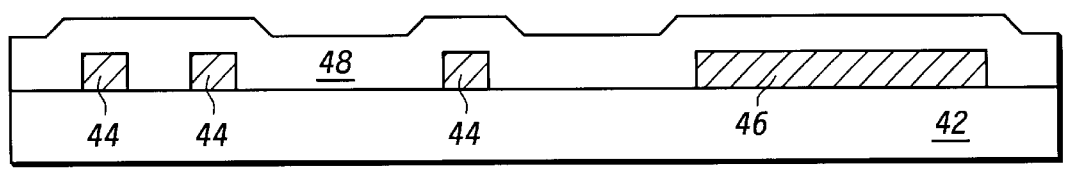
FIGS. 8–11 illustrate in partial, cross-sectional views a semiconductor device formed in accordance with another embodiment of the present invention in which a dummy feature is added to a receiving semiconductor substrate in the region where bonding of another semiconductor layer is to occur.
Figure 9:
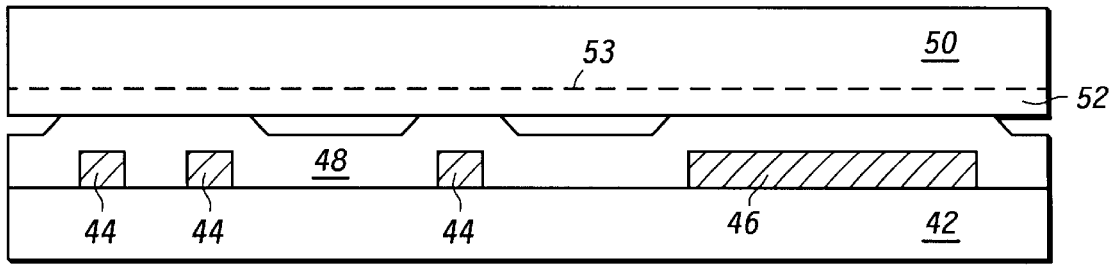

An alternative method for addressing the problems associated with bonding to a non-planar receiving substrate is demonstrated in reference to FIGS. 8–11, which illustrate a fabrication sequence to form a semiconductor device 40 also in accordance with the present invention. As shown in FIG. 8, a receiving substrate 42 includes conductive members 44 and a first dielectric layer 48. These elements are analogous, respectively, to receiving substrate 20, conductive members 22, and first dielectric layer 24 of the previous embodiments. In addition, receiving substrate 42 includes a dummy feature 46 which is formed in a location where transfer of a layer from a donor substrate 50 is to occur. Donor substrate 50 is shown in FIG. 9, and as previously described in reference to donor substrate 12, is preferably a single crystalline semiconductor material and includes an implant region 52 and has a peak concentration of the implanted species (preferably hydrogen) represented by dashed line 53.

Dummy feature 46 is provided to raise the area of the receiving substrate 42 where bonding to the donor substrate 50 is to occur. By making the area of the receiving substrate where bonding is to occur at least as high or higher than other structures on the receiving substrate, sufficient bonding at this area can be assured. For example, as illustrated in FIG. 9, conductive members 44 cause the upper surface of receiving substrate 42 to be non-planar. A dummy feature 46 is provided to create an elevated surface on which bonding can occur. The dummy feature is preferably formed simultaneously with and of the same material as the conductive members or other topographical features to avoid additional processing steps. The dummy feature need not be formed of any particular material (e.g. it could be made of dielectric material rather than a conductive material). The size and shape of the dummy feature generally should be selected so that it is the same size or larger than the portion of the donor substrate 50 to be bonded and transferred. While only one dummy feature is illustrated, a plurality of dummy features can be used to achieve the same or similar effect.

In accordance with the invention, the receiving substrate 42 having dummy feature 46 is bonded to donor substrate 50 as shown in FIG. 9. Bonding of the donor substrate 50 to the receiving substrate 42 can be accomplished as previously described, and will preferably occur only in those areas where contact is made between the two substrates (including the area above dummy feature 46).

Figure 10:
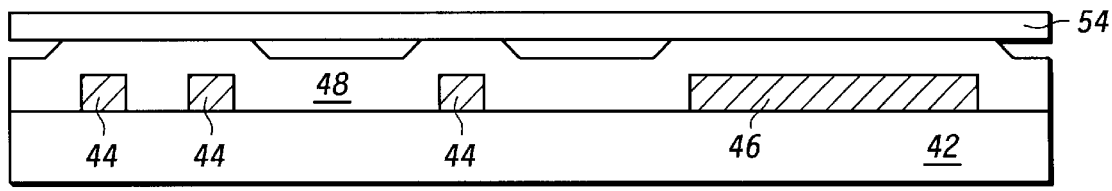
Figure 11:
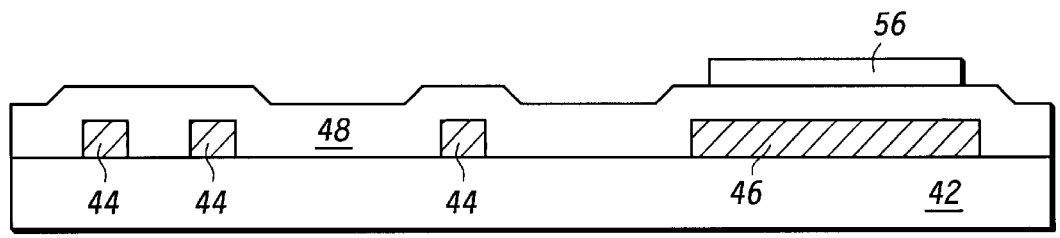

As shown in FIG. 10, the bulk portion of donor substrate 50 is removed, leaving a transfer layer 54 across the entire surface of receiving substrate 42. This removal process is preferably accomplished using one of the techniques previously described in reference to removal of the bulk portion of donor substrate 12. Alternatively, an etch-back technique could instead be used. Transfer layer 54 is then lithographically patterned and etched to leave a patterned transfer layer 56 over dummy feature 46 as shown in FIG. 11. The patterned transfer layer can then be process to form a device, e.g. an optical device such as a photodetector which can be electrically coupled to circuitry formed on the receiving substrate 42.

Thus, it should be apparent that there has been provided an improved substrate bonding process which can be accomplished using a non-planar receiving substrate, and further which can result in selective bonding. Use of a donor mesa formed in a donor substrate enables selective transfer of a semiconductor material to a receiving substrate. The receiving substrate need not be highly planar, and it can be modified to include a mesa receiving cavity to further improve planarity of the final bonded structure. The proposed fabrication method has a high degree of controllability in thickness of the transferred layer. Moreover, the invention is particularly advantageous in applications in which dissimilar semiconductor materials are to be bonded together because parallel processing can be accomplished rather than serially bonding devices of one semiconductor material to another. Transferring the donor mesa semiconductor material to one or more selected regions of the receiving substrate and providing a planar surface after the mesa transfer, facilitates the use of subsequent integrated circuit processing steps which can be shared by both donor and receiving substrate portions. For example, metallization and interlevel dielectrics can be fabricated on both the donor mesa and receiving substrate portions of the overall semiconductor device.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In the foregoing specification, the invention has been described with reference to specific embodiments. However, one of ordinary skill in the art appreciates that various modifications and changes can be made without departing from the scope of the present invention as set forth in the claims below. For example, one skilled will recognize that it is possible to combine one or more aspects of any one embodiment described with another embodiment (e.g. donor mesas can be used in conjunction with dummy features). Additionally, one skilled in the art will recognize that the donor substrate can include devices, or partial devices, formed therein prior to bonding to the receiving wafer. Moreover, the receiving substrate can include devices, or partial devices, formed therein prior to bonding the donor substrate to the receiving substrate. Further, various processes, as are known in the art, can be performed to complete the integrated circuit device following the bonding of the donor substrate to the receiving substrate. Accordingly, the specification and figures are to be regarded in an illustrative rather than a restrictive sense, and all such modifications are intended to be included within the scope of present invention.

What is claimed is:

1. A method of forming a semiconductor device comprising:
   implanting a species into a donor substrate to form an implant region;
   patterning the donor substrate to form a bulk portion and a donor mesa, wherein the donor mesa comprises at least a portion of the implant region;
   bonding the donor substrate to a receiving substrate via the donor mesa, wherein the receiving substrate comprises a receiving cavity; and
   removing the bulk portion of the donor substrate while leaving a transferred layer of the donor substrate bonded to the receiving substrate within the receiving cavity, wherein the transferred layer comprises the donor mesa.

2. The method of claim 1, wherein removing the bulk portion is performed using a mechanical method.

3. The method of claim 1, wherein removing the bulk portion is performed using a thermal method.

4. The method of claim 1, wherein the receiving cavity comprises a trench within the semiconductor material and wherein the transferred layer is bonded within the trench.

5. The method of claim 4, further comprising forming a second dielectric layer within the trench and wherein the transferred layer is bonded to the second dielectric layer within the trench.

6. The method of claim 1, wherein implanting is performed before patterning the donor substrate.

7. The method of claim 6, wherein patterning the donor substrate comprises removing portions of the implant region beyond the donor mesa.

8. The method of claim 1, wherein the receiving substrate comprises a semiconductor material and a first dielectric layer over the semiconductor material.

9. The method of claim 8, wherein the receiving cavity comprises a recess, wherein the recess is in the first dielectric layer and the transferred layer is bonded within the recess.

10. The method of claim 8, wherein the receiving cavity comprises an opening, wherein the opening is in the first dielectric layer and the transferred layer is within the opening.

11. The method of claim 10, wherein the opening exposes a portion of the semiconductor material and the transferred layer is bonded to the exposed portion of the semiconductor material.

12. The method of claim 10, wherein a second dielectric layer is formed over the receiving substrate and within the opening and the transferred layer is bonded to the second dielectric layer.

13. The method of claim 1, wherein the donor substrate and the receiving substrate each comprise an element selected from the group consisting of germanium, gallium, arsenic, indium, phosphorus and silicon.

14. The method of claim 13, wherein the donor substrate and the receiving substrate are different materials.

15. The method of claim 14, wherein the donor substrate comprises single crystalline germanium and the receiving substrate comprises single crystalline silicon.

16. The method of claim 15, further comprising forming a photodetector in the transferred layer.

17. A method of forming a semiconductor device comprising:
   providing a first semiconductor substrate, wherein the first semiconductor substrate is patterned to form a mesa and a bulk portion;
   providing a second semiconductor substrate, wherein the second semiconductor substrate has a non-planar topography, wherein the second semiconductor substrate comprises a receiving cavity;
   bonding the first semiconductor substrate to the second semiconductor substrate, wherein the bonding further comprises bonding the mesa within the receiving cavity; and
   removing the bulk portion of the first semiconductor substrate while leaving at least a portion of the mesa bonded to the first semiconductor substrate.

18. The method of claim 17, wherein the second semiconductor substrate comprises a first dielectric layer over a semiconductor material, the non-planar topography receiving cavity comprises a recess in the first dielectric layer, and the mesa is bonded to the recess.

19. The method of claim 17, wherein removing the bulk portion is performed mechanically.

20. The method of claim 17, wherein removing the bulk portion is performed thermally.

21. The method of claim 17, wherein the first semiconductor substrate and the second semiconductor substrate each comprise an element selected from the group consisting of singe crystalline silicon, single crystalline germanium, single crystalline gallium arsenide, and single crystalline indium phosphide.

22. The method of claim 17, wherein the first semiconductor substrate comprises single crystalline germanium and the second semiconductor substrate comprises single crystalline silicon.

23. The method of claim 22, further comprising forming a photodetector in a portion of the mesa which is left after removing the bulk portion.

24. The method of claim 17, wherein the second semiconductor substrate comprises a first dielectric layer over a semiconductor material, the receiving cavity of the second semiconductor substrate comprises a trench in the semiconductor material, and the mesa is bonded to the second semiconductor substrate within the trench.

25. The method of claim 24, wherein a second dielectric layer is formed within the trench and the mesa is bonded to the second semiconductor substrate over the second dielectric layer.

26. The method of claim 17, wherein the second semiconductor substrate comprises a first dielectric layer over a semiconductor material, the receiving cavity of the second semiconductor substrate comprises an opening in the first dielectric layer which exposes a portion of the semiconductor material, and the mesa is bonded to the second semiconductor substrate within the opening.

27. The method of claim 26, wherein a second dielectric layer is formed within the opening and the mesa is bonded to the second semiconductor substrate over the second dielectric layer and within the opening.

28. The method of claim 26, wherein the mesa is bonded to an exposed portion of the semiconductor material.

29. A method of forming a semiconductor device comprising:

implanting a species into a donor substrate to form an implant region;

patterning the donor substrate to form a bulk portion and a donor mesa, wherein the donor mesa comprises at least a portion of the implant region, wherein patterning the donor substrate is performed after the implanting;

bonding the donor substrate to a receiving substrate via the donor mesa; and removing the bulk portion of the donor substrate while leaving a transferred layer of the donor substrate bonded to the receiving substrate.

* * * * *

UNITED STATES PATENT AND TRADEMARK OFFICE
CERTIFICATE OF CORRECTION

PATENT NO.    : 6,616,854 B2
DATED         : September 9, 2003
INVENTOR(S)   : Jones et al.

It is certified that error appears in the above-identified patent and that said Letters Patent is hereby corrected as shown below:

<u>Title page,</u>
Item [73], Item [*] Notice, change "Subject to any disclaimer, the term of this patent is extended or adjusted under 35 U.S.C. 154(b) by 0 days" to -- Subject to any disclaimer, the term of this patent is extended or adjusted under 35 U.S.C. 154(b) by 74 days --

Signed and Sealed this

Eighteenth Day of May, 2004

JON W. DUDAS
*Acting Director of the United States Patent and Trademark Office*